(12) United States Patent
Lee et al.

(10) Patent No.: US 8,482,129 B2
(45) Date of Patent: Jul. 9, 2013

(54) WAFER-LEVEL STACK PACKAGE AND METHOD OF FABRICATING THE SAME

(75) Inventors: In-Young Lee, Gyunggi-do (KR); Ho-Jin Lee, Seoul (KR); Hyun-Soo Chung, Gyunggi-do (KR); Ju-Il Choi, Gyunggi-do (KR); Son-Kwan Hwang, Gyunggi-do (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 206 days.

(21) Appl. No.: 13/027,594

(22) Filed: Feb. 15, 2011

(65) Prior Publication Data

US 2011/0147946 A1    Jun. 23, 2011

Related U.S. Application Data

(62) Division of application No. 12/053,478, filed on Mar. 21, 2008, now Pat. No. 7,897,511.

(30) Foreign Application Priority Data

Mar. 23, 2007   (KR) ................................ 2007-28864

(51) Int. Cl.
*H01L 23/48*   (2006.01)
(52) U.S. Cl.
USPC ............. 257/774; 257/686; 257/E21.577; 257/E21.649; 257/E23.085; 257/E23.145; 257/E23.174; 438/667; 438/672

(58) Field of Classification Search
USPC ................... 257/E21.577, E21.649, E23.085, 257/E23.145, E23.174, 686, 774; 438/667, 438/672
See application file for complete search history.

(56) References Cited

U.S. PATENT DOCUMENTS

| | | | |
|---|---|---|---|
| 7,214,615 B2 | 5/2007 | Miyazawa | |
| 7,358,602 B2 * | 4/2008 | Hara | ............................. 257/689 |
| 2002/0115290 A1 | 8/2002 | Halahan et al. | |

FOREIGN PATENT DOCUMENTS

| | | |
|---|---|---|
| JP | 2002-270718 | 9/2002 |
| JP | 2004-095849 | 3/2004 |
| JP | 2004-288722 | 10/2004 |
| JP | 2005-236245 | 9/2005 |
| KR | 2002-0012061 | 2/2002 |
| KR | 2004-0101924 | 12/2004 |
| KR | 2005-0021078 | 3/2005 |
| KR | 2005-0118904 | 12/2005 |

\* cited by examiner

*Primary Examiner* — Asok K Sarkar
(74) *Attorney, Agent, or Firm* — Muir Patent Consulting, PLLC

(57) ABSTRACT

A method of manufacturing a semiconductor device includes forming an integrated circuit region on a semiconductor wafer. A first metal layer pattern is formed over the integrated circuit region. A via hole is formed to extend through the first metal layer pattern and the integrated circuit region. A final metal layer pattern is formed over the first metal layer pattern and within the via hole. A plug is formed within the via hole. Thereafter, a passivation layer is formed to overlie the final metal layer pattern.

6 Claims, 7 Drawing Sheets

WAFER-LEVEL STACK PACKAGE AND METHOD OF FABRICATING THE SAME

CROSS-REFERENCE TO RELATED PATENT APPLICATION

This application claims the benefit of priority to and is a Divisional of U.S. patent application Ser. No. 12/053,478, filed Mar. 21, 2008, now U.S. Pat. No. 7,897,511, which claims priority under 35 USC §119 to Korean Patent Application No. 2007-28864, filed on Mar. 23, 2007 in the Korean Intellectual Property Office, the disclosure of each of which is incorporated herein in its entirety by reference.

BACKGROUND

1. Field of Invention

Example embodiments of the present invention relate to the field of semiconductor manufacturing. More particularly, example embodiments of the present invention relate to methods of fabricating wafer-level stack packages, in which semiconductor chips are stacked at a wafer level and connected to one another using a conductive through via.

2. Description of the Related Art

Recently, a wafer-level three-dimensional (3D) chip stack package has received much attention in the semiconductor industry due to its advantages such as high performance, short vertical interconnections, high density, multi-functionality, and/or small dimensions. In the wafer-level 3D chip stack package, typically a conductive through via is formed to vertically extend through individual wafers and chips in the wafers are subsequently singulated and stacked to be electrically connected to one another using conductive through vias to form a wafer stack package (WSP). Conventionally, the conductive through via is formed after a passivation layer is formed over the wafers, as will be described below.

FIG. 1 is a flow chart describing a conventional method of forming a WSP discussed above. At step S10, integrated circuits are formed on a wafer using conventional chip fabrication processes. This process includes the formation of discrete devices such as a transistor and a resistor, the formation of a final metal layer to interconnect discrete devices to form integrated circuits. Lastly, a passivation layer is formed to protect the chips formed on the wafer.

In the next step at S20, an electrical die sort (EDS) test is performed on the wafer. Thereafter, at step S30, a conductive through via is formed into the wafer having the passivation layer. Then, a plurality of semiconductor chips with the conductive through via from the wafer are stacked to form a WSP using a redistribution layer process. If a defect occurring at step S30 is not detected until the EDS test performed after the stacking of the chips, all of semiconductor chips in the stack must be scrapped. Consequently, to avoid these risks, $2^{nd}$ or additional EDS test may need to be performed repeatedly after forming the conductive through via. See step S40.

However, these processing steps described above are time consuming and substantially increase manufacturing costs.

SUMMARY

One embodiment exemplarily described herein can be characterized as a method of manufacturing a semiconductor device that includes forming an integrated circuit region on a semiconductor wafer. A first metal layer pattern is formed over the integrated circuit region. A via hole is formed to extend through the first metal layer pattern and the integrated circuit region. A final metal layer pattern is formed over the first metal layer pattern and within the via hole. A plug is formed within the via hole. Thereafter, a passivation layer is formed to overlie the final metal layer pattern.

BRIEF DESCRIPTION OF THE DRAWINGS

Hereinafter, embodiments of the present invention will be described with reference to the accompanying drawings, in which.

DETAILED DESCRIPTION

Figure 1:
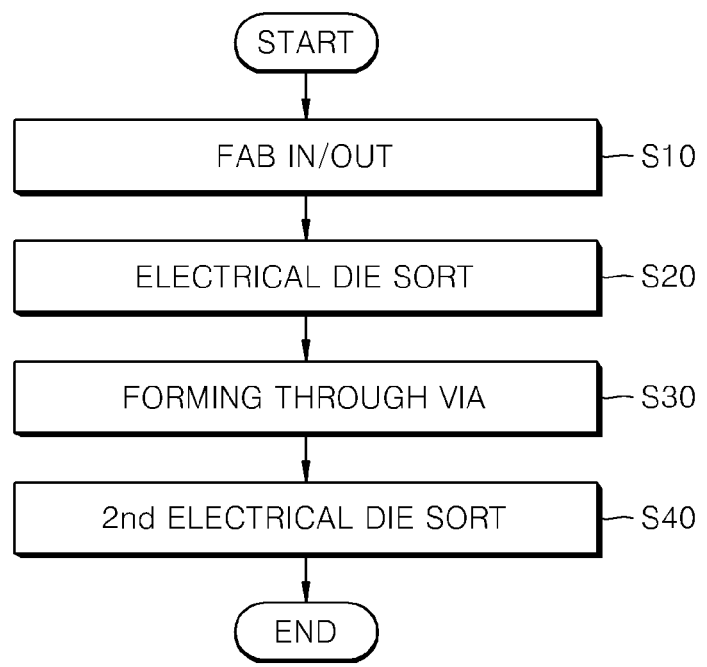
FIG. 1 is a flow chart describing a conventional method of forming a wafer-level stack package.

Example embodiments of the present invention will now be described more fully hereinafter with reference to the accompanying drawings. These embodiments may, however, be realized in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

Figure 2:
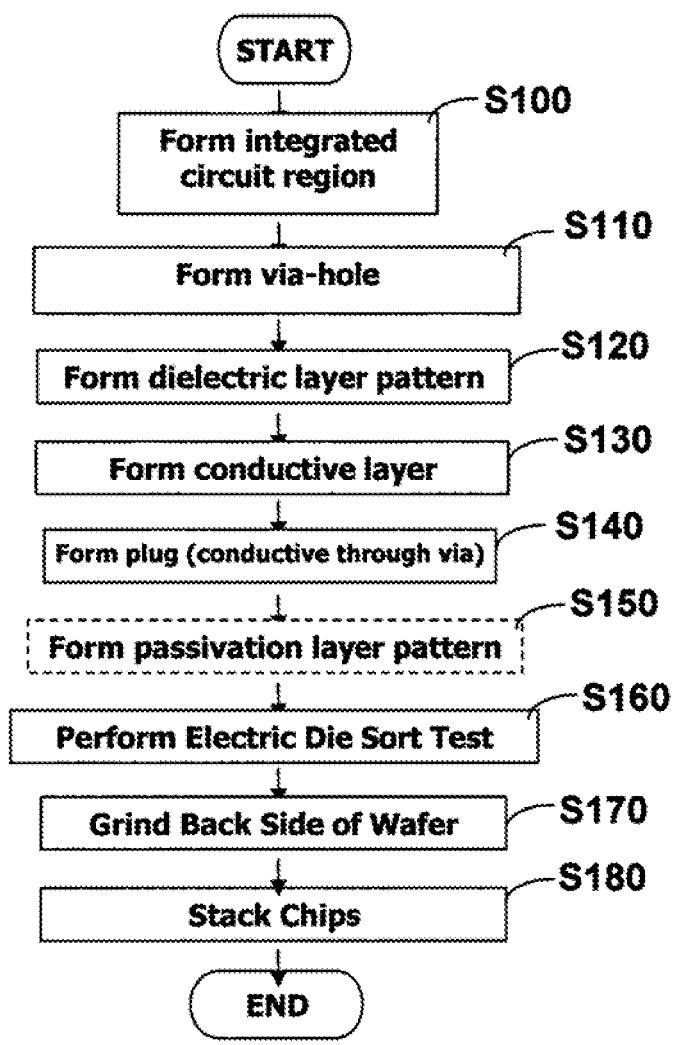
FIG. 2 is a flow chart describing an example method of forming a wafer-level stack package according to one embodiment.

FIG. 2 is a flow chart describing an example method of forming a wafer-level stack package (WSP) according to one embodiment.

Referring to FIG. 2, a WSP may be formed by providing a semiconductor wafer and forming an integrated circuit region on the semiconductor wafer at step S100. In one embodiment, the integrated circuit region may comprise memory devices, logic device, or the like or a combination thereof, formed by any suitable process.

At step S110, a via hole is formed through the integrated circuit region. In one embodiment, the via hole is formed before forming a final conductive layer pattern, e.g., a final metal layer pattern, (also referred to herein as an "uppermost conductive layer pattern" or a "second conductive layer pattern") associated with the integrated circuit region. The final conductive layer pattern may be a so-called "metal 2 layer" (i.e., "M2 layer), as known to one skilled in the art in the case of some memory devices DRAM. However, one skilled in the art will appreciate that the final conductive layer pattern may be a so-called "metal 3 layer" (i.e., "M3 layer") or higher depending on the type of the semiconductor device.

At step S120, a dielectric layer pattern (also referred to herein as an "insulating layer pattern" and "an inter-metal dielectric (IMD) layer" is formed over the semiconductor wafer, including the integrated circuit region. In one embodiment, the dielectric layer is formed within the via hole. The dielectric layer may be disposed on sidewalls of the via hole. The dielectric layer may also be disposed on a bottom surface of the via hole.

At step S130, the final conductive layer pattern is formed on the dielectric layer pattern. In one embodiment, the final conductive layer pattern directly contacts the dielectric layer pattern. In another embodiment, the final conductive layer pattern is formed within the via hole.

At step S140, a plug or a conductive through via is formed within the via hole. As will be described in greater detail below, the plug may include a conductive material, an insulating material or a combination thereof.

In an embodiment where the plug includes a conductive material, a passivation layer pattern (also referred to herein as an "uppermost dielectric layer") may be formed over the plug. See step S150. In such an embodiment, the passivation layer pattern expose a portion of the plug.

At step S160, an electrical die sorting (EDS) test is performed. At step S170, a back side of the semiconductor wafer is ground to expose the final conductive layer pattern. At step S180, the semiconductor wafer is singulated to separate dies formed therein. Individual dies may then be stacked to form a WSP.

FIGS. 3 to 11 are cross-sectional views illustrating an example method of forming a WSP according to one embodiment to further explain the fabrication of the WSP.

Figure 3:
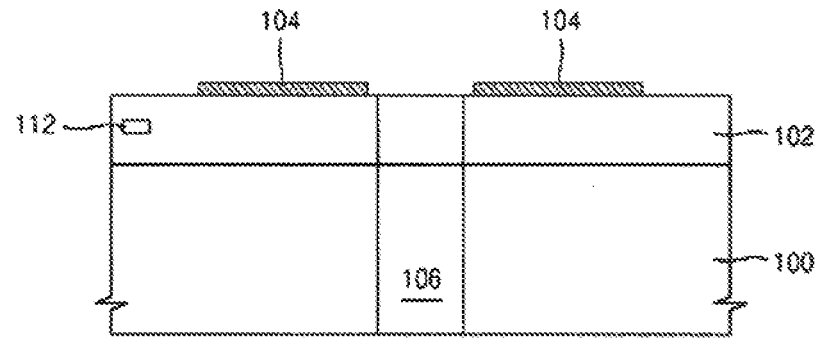
FIGS. 3 to 11 are cross-sectional views illustrating an example method of forming a wafer-level stack package according to one embodiment.

Referring to FIG. 3, an integrated circuit region 102 is formed on a semiconductor wafer 100 using conventional fabrication processes. In one embodiment, the integrated circuit region 102 may include one or more memory devices, one or more logic devices, or the like or a combination thereof. It will be appreciated that devices within the integrated circuit region 102 may be formed by any suitable process.

A first conductive layer pattern 104 may then be formed over the integrated circuit region 102. As used herein, the term "integrated circuit region" may refer to the strucuture(s) formed before the first conductive layer pattern 104 is formed. In one embodiment, the first conductive layer pattern 104 may be formed over the integrated circuit region 102 at a location corresponding to the location of a subsequently-formed bond pad or a conductive through via. The first conductive layer pattern 104 may also be electrically connected with one or more devices included within the integrated circuit region 102. Accordingly, the first conductive layer pattern 104 can also be referred to as a "first metallization layer pattern," a "metal-1 layer," an "M1 layer," etc.

The first conductive layer pattern 104 may be formed by forming a first conductive material over the semiconductor wafer 100 including the integrated circuit region 102 followed by patterning the first conductive material by any suitable technique. In one embodiment, the first conductive material may include aluminum, copper, titanium, titanium nitride, nickel, doped polysilicon or the like or a combination thereof.

In another embodiment, additional first conductive layer patterns (not shown) may be provided when the first conductive layer pattern 104 is formed. Such additional first conductive layer patterns may also be electrically connected with one or more devices included within the integrated circuit region 102. Accordingly, the first conductive layer pattern 104 and the additional first conductive layer patterns can be collectively referred to as "first metallization layer patterns M1" or "metal-1 layer."

In yet another embodiment, if copper is used to form the first conductive layer pattern 104, it is formed as a damascene structure in the integrated circuit region 102.

In one embodiment, the first conductive layer pattern 104 may directly overlie the integrated circuit region 102.

Also shown in FIG. 3 are a scribe region 106 and a fusing region (a fuse region) 112. In one embodiment, the scribe region 106 defines boundaries of adjacent die regions within the semiconductor wafer 100. In one embodiment, the fuse region 112 includes one or more fuses connected to at least one memory device included in an integrated circuit region 102.

Figure 4:
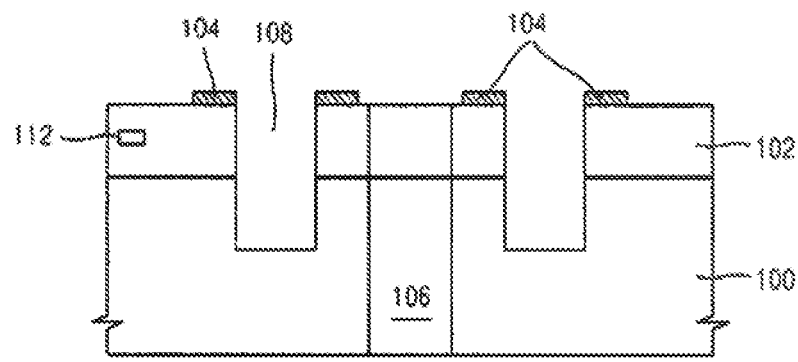

Referring to FIG. 4, a via hole 108 is formed to extend through the first metal layer pattern 104 and the integrated circuit region 102. In one embodiment, the via hole 108 partially extends through the semiconductor wafer 100. Accordingly, and as exemplarily shown in FIG. 4, the via hole 108 can be characterized as having sidewalls and a bottom surface. It will be appreciated that the location of the via hole 108 is not limited to the location explicitly illustrated in FIG. 4. Rather, the via hole 108 may be located within the scribe region 106 or within any other region of the semiconductor wafer 100. In one embodiment, the via hole 108 may extend below the bottom portion of the integrated circuit region 102.

In one embodiment, the via hole 108 may be formed using a dry etching technique, a wet etching technique, a laser drilling technique, a mechanical drilling technique, or the like or any combination thereof. As discussed in the background, via holes are conventionally formed after typical chip fabrication processes have been performed, i.e., after a final metal layer pattern (a second conductive layer pattern 116 in FIG. 5) and a passivation layer pattern have been formed. However, with some embodiments of the present invention, the via hole 108 is formed before the final metal layer pattern and/or the passivation layer pattern are formed.

Figure 5:
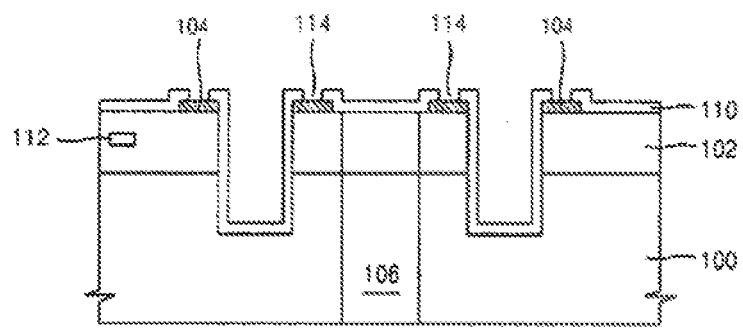

Referring to FIG. 5, a dielectric layer pattern 110 is formed over the semiconductor wafer 100 including the first conductive layer pattern 104 and within the via hole 108. As exemplarily illustrated, the dielectric layer pattern 110 may include one or more openings 114 that expose at least a portion of the first conductive layer pattern 104 such that it can be connected to a subsequently-formed second conductive layer pattern.

In one embodiment, the dielectric layer pattern 110 may be formed by depositing a dielectric material over the semiconductor wafer 100 followed by patterning of the dielectric material by any suitable method. The dielectric material may, for example, include an oxide (e.g., silicon oxide, or the like), a nitride (e.g., silicon nitride, or the like), a polymer (e.g., parylene, or the like) or a combination thereof.

In one embodiment, the dielectric layer pattern 110 prevents a subsequently-formed conductive structure from electrically contacting devices formed within the integrated circuit region 102 and from generating a leakage current.

In one embodiment, the dielectric layer pattern 110 may be formed to concurrently overlie the first conductive layer pattern 104 and on sidewalls of the via hole 108.

Figure 6:
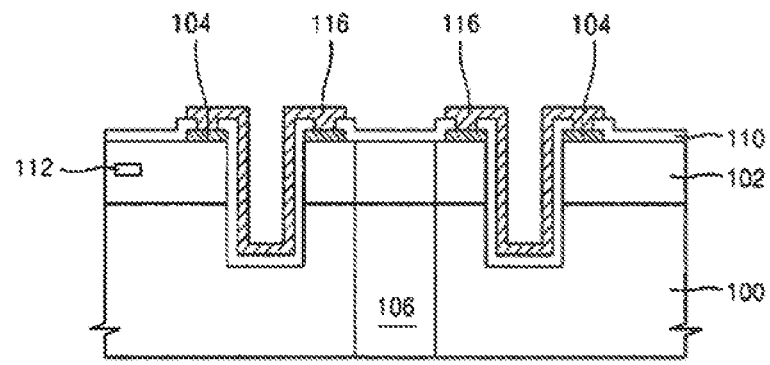

Referring to FIG. 6, a second conductive layer pattern 116 is formed over the dielectric layer pattern 110 and within the via hole 108. In one embodiment, the second conductive layer pattern 116 may be the last metal layer pattern formed prior to forming a passivation layer pattern thereon, excluding a seed layer. For this reason, the second conductive layer pattern may also be referred to as a "final metal layer pattern" or an "uppermost conductive layer pattern." The second conductive layer pattern 116 can also be referred to as a "second metallization layer pattern," a "metal-2 layer" or an "M2 layer."

The second conductive layer pattern 116 may be formed by depositing a second conductive material over the semiconductor wafer 100 including the integrated circuit region 102, the dielectric layer pattern 110 and the first conductive layer pattern 104 and within the via hole 108. Thereafter, the second conductive material may be patterned using any suitable technique. In one embodiment, the second conductive material may be blanket deposited over the integrated circuit region 102. In one embodiment, the second conductive material may include aluminum, copper, titanium, titanium nitride, nickel, doped polysilicon or the like or a combination thereof.

In one embodiment, the second conductive layer pattern 116 may be formed over the integrated circuit region 102 at a location corresponding to the location of a subsequently-formed bond pad. The second conductive layer pattern 116 may also be electrically connected to the first conductive layer pattern 104 via the one or more openings 114 included within the dielectric layer pattern 110.

In embodiments where additional first conductive layer patterns (not shown) are formed, additional openings (not shown) may be defined within the dielectric layer pattern 110 to expose the additional first conductive layer patterns. Accordingly, and in one embodiment, one or more additional second conductive layer patterns (not shown) may be provided on the dielectric layer pattern 110 and be electrically connected corresponding ones of the additional first conductive layer patterns via one or more of the additional openings. Accordingly, the second conductive layer pattern 116 and the additional second conductive layer patterns can be collectively referred to as "second metallization layer patterns M2." The second conductive layer pattern 116 may be a redistribution layer pattern to redistribute chip select pins formed in the integrated circuit region 102 as will be explained in FIG. 14 or FIG. 15.

Figure 7:
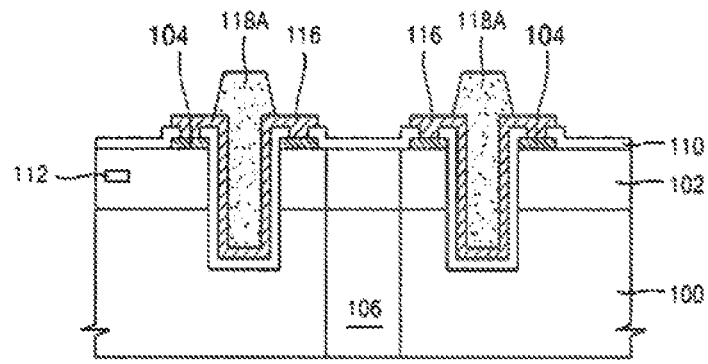

Referring to FIG. 7, a plug 118A is formed within the via hole 108. In one embodiment, the plug 118A overlies a portion of the second conductive layer pattern 116 formed outside the via hole 108. In another embodiment, the plug 118A protrudes above an upper surface of the integrated circuit region 102. In yet another embodiment, the plug 118A protrudes above an upper surface of the second conductive layer pattern 116.

In one embodiment, the plug 118A includes a conductive material (e.g., copper, or the like). In an embodiment where the plug 118A includes copper, the plug 118A may be formed by, for example, forming a seed layer (not shown) within the via hole 108. The seed layer is then patterned. Thereafter, an electroplating process may be performed using the seed layer to selectively provide a conductive material forming the plug 118A. The seed layer may be formed within the via hole 108 using a process such as sputtering. It will be appreciated, however, that other known methods of forming the plug 118A from conductive material may be applied.

Figure 8:
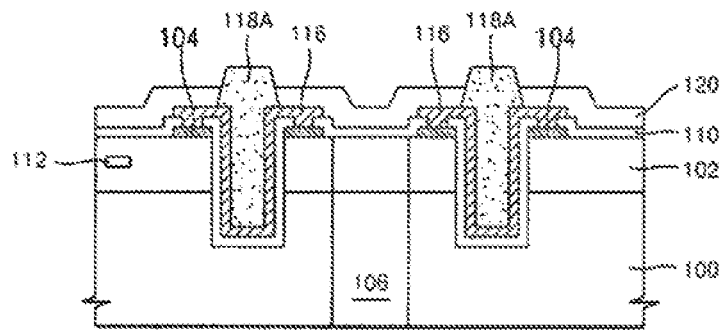

Referring to FIG. 8, a passivation layer pattern (uppermost dielectric layer pattern) 120 may be formed over the dielectric layer pattern 110 and also over the second conductive layer pattern 116. The passivation layer pattern 120 may be disposed along a sidewall of a portion of the plug 118A protruding above the upper surface of the second conductive layer pattern 116. Accordingly, the passivation layer pattern 120 may cover a portion of the plug 118A, and the second conductive layer pattern 116 may be covered by the plug 118A and the passivation layer pattern 120. In one embodiment, the passivation layer pattern 120 does not extend into the via hole 108.

In one embodiment, the plug 118A may protrude above the passivation layer 120 and include a conductive material. Accordingly, the plug 118A may be used as an interconnection terminal of a subsequently-formed wafer-level stack package, in which a plurality of chips are vertically stacked.

In one embodiment, the passivation layer pattern 120 may be formed by forming an insulating material over the semiconductor wafer 100 including the dielectric layer pattern 110, the second conductive layer 116 and the plug 118A, followed by patterning the insulating material by any suitable technique. In one embodiment, the passivation layer pattern 120 may include a material such as an oxide (e.g., silicon oxide, or the like), a nitride (e.g., silicon nitride), or the like or a combination thereof.

In one embodiment, no other dielectric layer is formed on the passivation layer pattern 120. Accordingly, the passivation layer pattern 120 may be referred to as an "uppermost dielectric layer pattern."

After forming the passivation layer pattern 120, an electric die sort (EDS) test is performed to determine whether devices within an integrated circuit region 102 are defective. During the EDS test, a test probe may contact the upper surface of the plug 118A. The EDS test may be performed while stacking chips for forming the WSP. As a result, multiple EDS tests required in the prior art are not needed with embodiments of the present invention, which in turn decreases the time and cost of manufacturing WSP.

Figure 9:
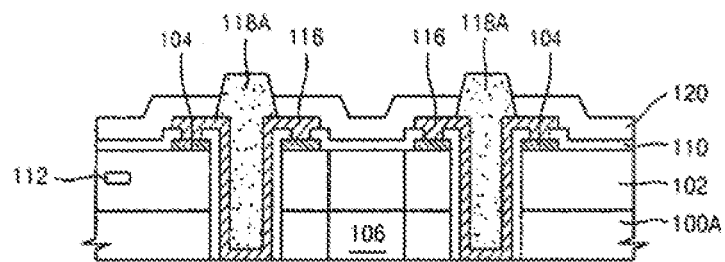

Referring to FIG. 9, after the EDS test is complete, a bottom portion of the semiconductor wafer 100 may be removed. In one embodiment, a bottom portion of the semiconductor wafer 100 may be removed by grinding the back side of the semiconductor wafer 100. In one embodiment, the back side of the semiconductor wafer 100 is ground such that a portion of the second conductive layer pattern 116 (e.g., a portion of the second conductive layer pattern 116 previously disposed on the bottom surface of the via hole 108) is exposed from the bottom of the semiconductor wafer 100. In another embodiment, however, the back side of the semiconductor wafer 100 may be ground such that a portion of the plug 118A is exposed from the bottom of the semiconductor wafer 100.

Figure 10:
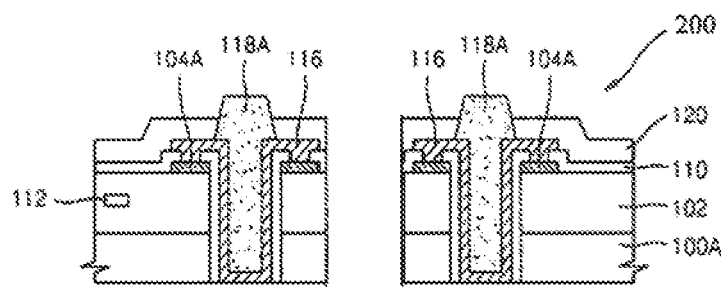

Referring to FIG. 10, after the back side of the semiconductor wafer 100 is ground, the semiconductor wafer 100 is singulated such that individual die regions within the semiconductor wafer 100 are separated from each other. As a result of singulating the semiconductor wafer, a plurality of dies 200 are formed. In one embodiment, individual die regions within the semiconductor wafer 100 may be separated from each other by performing a cutting operation along the scribe region 106.

Figure 11:
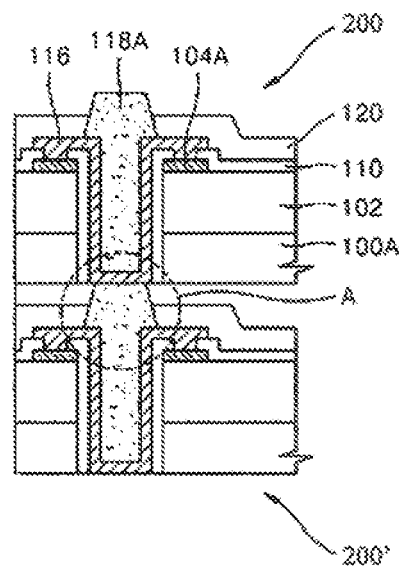

Referring to FIG. 11, individual dies 200 and 200' may be stacked to form a wafer-level stack package. As exemplarily shown, an upper die 200 and a lower die 200' are electrically connected at a region where the second conductive layer pattern 116 of the upper die 200, exposed from the bottom surface of the semiconductor wafer 100, contacts the upper surface of plug 118A of the lower die 200', protruding above the upper surface of the second conductive layer pattern 116 or the passivation layer 120. Although FIG. 11 illustrates only two stacked dies, it will be appreciated that any number and type of dies may be stacked according to the methods described herein.

Figure 12:
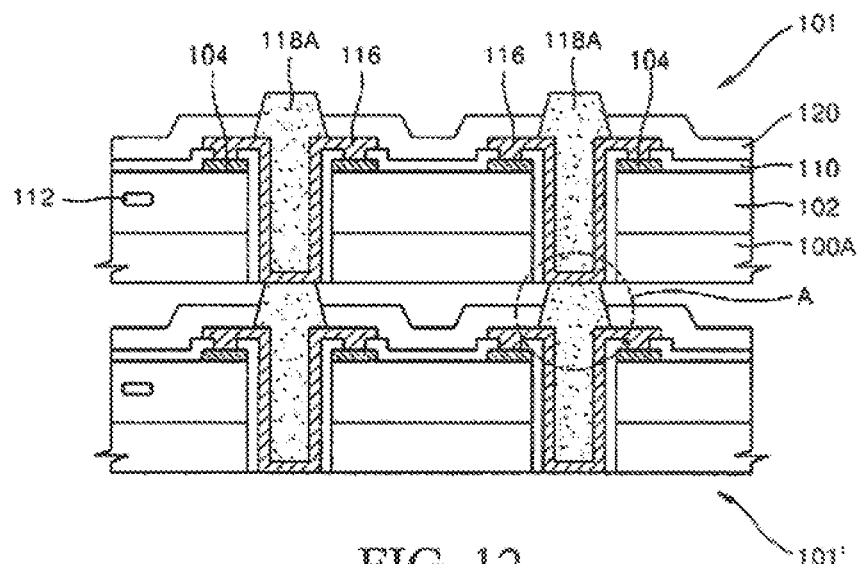
FIG. 12 is a cross-sectional view illustrating a wafer-level stack package according to another embodiment.

FIG. 12 is a cross-sectional view illustrating a wafer-level stack package according to another embodiment.

Referring to FIG. 12, semiconductor devices 101 and 101' may be formed and stacked in a manner similar to that described above with respect to FIGS. 3 to 11. As exemplarily shown, an upper semiconductor device 101 and a lower semiconductor device 101' are electrically connected at a region where the second conductive layer pattern 116 of the upper semiconductor device 101, exposed from the bottom surface of the semiconductor wafer 100, contacts the upper surface of plug 118A of the lower semiconductor device 101', protruding above the upper surface of the second conductive layer pattern 116 or the passivation layer 120. Although FIG. 12 illustrates only two stacked semiconductor devices, it will be appreciated that any number and type of semiconductor devices may be stacked according to the methods described herein.

Figure 13:
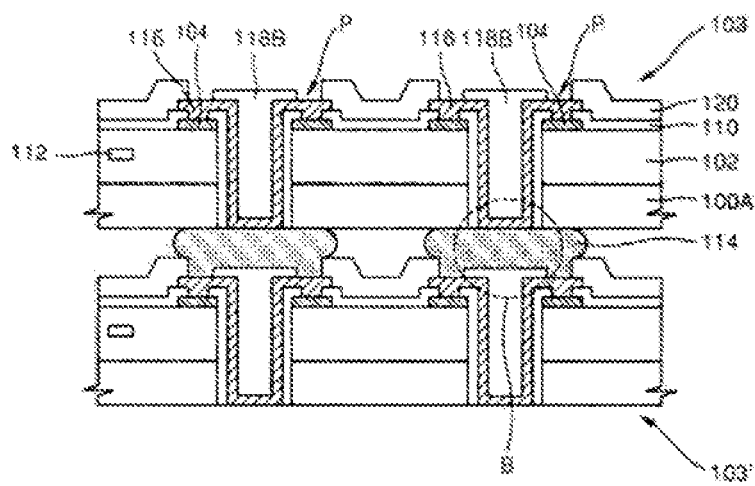
FIG. 13 is a cross-sectional view illustrating a wafer-level stack package according to another embodiment.

FIG. 13 is a cross-sectional view illustrating a wafer-level stack package according to another embodiment.

Referring to FIG. 13, semiconductor devices 103 and 103' may be formed and stacked in a manner similar to that described above with respect to FIG. 12. In the present embodiment, however, a plug 118B including an insulating material may be formed within the via hole 108 instead of the aforementioned plug 118A including conductive material. In one embodiment, the insulating material of the plug 118B may include a polymer deposited by performing a vacuum lamination process. In another embodiment, the insulating material of the plug 118B may include a polymer.

In the embodiment shown in FIG. 13, the passivation layer pattern 120 may be spaced apart from a sidewall of a portion of the plug 1188 protruding above the upper surface of the second conductive layer pattern 116. Accordingly, at least a portion of the second conductive layer pattern 116 may be exposed at a region P defined between the plug 118B and the passivation layer pattern 120.

As exemplarily shown, a solder ball 114 is provided to electrically connect the upper semiconductor device 103 and the lower semiconductor device 103'. For example, the solder ball 114 contacts the second conductive layer pattern 116 of the upper semiconductor device 103, exposed from the bottom surface of the semiconductor wafer 100, and contacts the upper surface of second conductive layer pattern 116, exposed at the region P defined between the plug 118B and the passivation layer pattern 120. Although FIG. 13 illustrates only two stacked semiconductor devices, it will be appreciated that any number and type of semiconductor devices may be stacked according to the methods described herein.

In this embodiment, the top surface of the plug 118B may be located below the top surface of the passivation layer 120 for more secure connection between the devices 103 and 103'.

Figure 14:
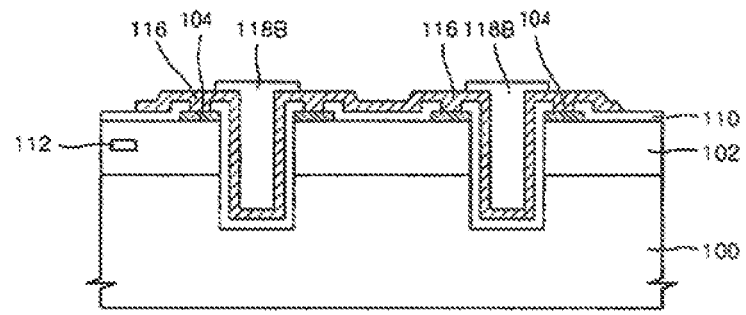
FIGS. 14 and 15 are cross-sectional views illustrating an example method of forming a wafer-level stack package according to still another embodiment.
Figure 15:
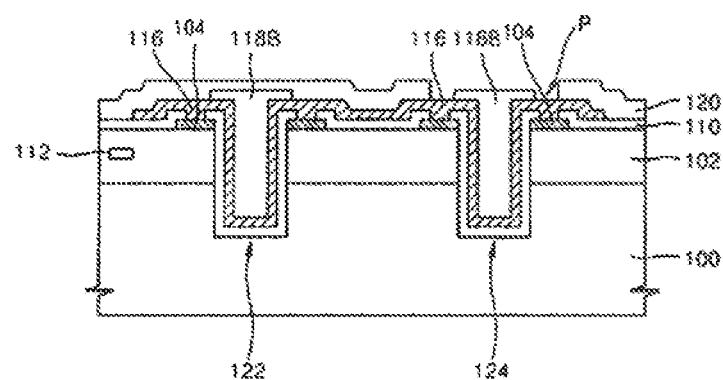

FIGS. 14 and 15 are cross-sectional views illustrating an example method of forming a wafer-level stack package according to still another embodiment.

Referring to FIGS. 14 and 15, a semiconductor device may be formed in a manner similar to that described above with respect to FIG. 13. In the present embodiment, however, the passivation layer pattern 120 is formed so as to substantially completely cover an initial chip selection (CS) contact pad 122 and include an opening P only at the region of final CS contact pad 124. In this embodiment, a second conductive layer pattern 116 may be used as a redistribution line for CS pads 122 and 124. In other words, the initial CS contact pad 122 is formed to be coupled to an integrated circuit region 102 and is redistributed to the final CS contact pad 124 using the second conductive layer pattern 116 as a redistribution line. As a result, with such CS pads 122 and 124, chips can be selected among stacked chips in a WSP. Additional processes such as those described above with respect to FIGS. 9-12 may be performed to form a WSP as desired.

The second conductive layer pattern 116 is electrically connected to a first conductive layer pattern 104 through an opening (e.g., a via) formed in a dielectric layer pattern 110 disposed between the first conductive layer pattern 104 and the second conductive layer pattern 116.

Figure 16:
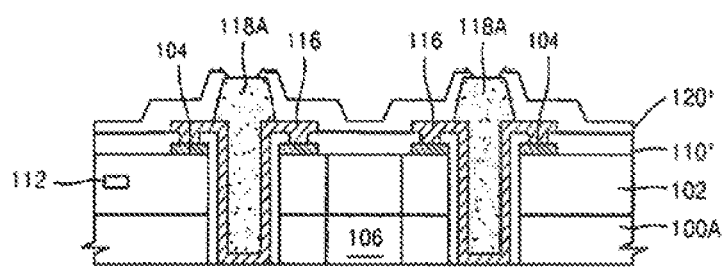
FIG. 16 is a cross-sectional view illustrating a wafer-level stack package according to another embodiment.

FIG. 16 is a cross-sectional view illustrating a wafer-level stack package according to another embodiment.

Referring to FIG. 16, a method of forming a WSP according to another embodiment may, for example, include the same methods as described with respect to FIGS. 3 to 7. According to the present embodiment, however, the passivation layer pattern 120' may be disposed on an upper surface of (i.e., overlie) the plug 118A. Accordingly, the passivation layer pattern 120' may cover a portion of the plug 118A and the second conductive layer pattern 116 may be covered by the plug 118A and the passivation layer pattern 120'. After forming the passivation layer pattern 120', the same method as described with respect to FIGS. 9 to 11 may be performed to form a WSP.

Upon electrically connecting dies or semiconductor devices formed according to the embodiment shown in FIG. 16, a solder ball (not shown) may be interposed between vertically adjacent die or semiconductor devices as similarly described above with respect to FIG. 13. For example, a solder ball may contact the second conductive layer pattern 116 of the upper die or semiconductor device, exposed from the bottom surface of the semiconductor wafer 100, and may also contact a portion of the upper surface of the plug 118A exposed by the passivation layer pattern 120'.

According to the embodiments exemplarily described above, a wafer stack packaging process can be simplified compared to that of the prior art by forming the via hole 108 before forming the second conductive layer pattern 116. Additionally, the wafer stack packaging process exemplarily described above requires only one EDS test whereas conventional wafer stack packaging processes require multiple EDS tests. In particular, because a conductive through via is formed before the EDS test, the occurrence of defects when chips are stacked to form a WSP can be significantly reduced, thereby reducing the number of EDS tests. Therefore, use of the wafer stack packaging process exemplarily described above can increase fabrication productivity while reducing cost and time required to fabricate a wafer-level stack package.

Embodiments of the present invention may be practiced in many ways. What follows is a non-limiting description of exemplary embodiments of the present invention.

According to one example embodiment, a method of manufacturing a semiconductor device may include forming an integrated circuit region on a semiconductor wafer; forming a first metal layer pattern over the integrated circuit region; forming a via hole extending through the first metal layer pattern and the integrated circuit region; forming a final metal layer pattern over the first metal layer pattern and within the via hole; forming a plug within the via hole; and thereafter, forming a passivation layer overlying the final metal layer pattern.

In one embodiment, the plug may comprise a conductive material.

In one embodiment, the plug may comprise an insulating material.

In one embodiment, the passivation layer may cover a portion of the plug.

According to another example embodiment, a method of manufacturing a semiconductor device may include forming an integrated circuit region on a semiconductor wafer; forming a first conductive layer pattern over the integrated circuit region; forming a via hole extending through the first conductive layer pattern and the integrated circuit region; forming an inter-metal dielectric (IMD) layer overlying the first conductive layer pattern and also disposed on a bottom and sidewalls of the via hole; forming a second conductive layer pattern over the IMD layer and also within the via hole; forming a plug within the via hole; and forming an uppermost dielectric layer overlying the second conductive layer pattern.

In one embodiment, the uppermost dielectric layer may cover a portion of the plug.

In one embodiment, the plug may comprise a conductive material.

In one embodiment, the plug may be formed by a method that includes forming a seed layer within the via hole and performing an electroplating process using the seed layer.

In one embodiment, the conductive material may comprise copper.

In one embodiment, the plug may comprise an insulating material.

In one embodiment, the plug may be formed by a method that includes performing a vacuum lamination process with using polymer.

In one embodiment, the uppermost dielectric layer may expose a portion of an upper surface of the plug and may cover a remaining portion of the plug.

In one embodiment, the via hole may be formed using a dry etching process, a wet etching process, a drilling process or a combination thereof.

In one embodiment, the integrated circuit region may comprises memory circuits.

In one embodiment, the IMD layer may have an opening and the second conductive layer pattern may be electrically connected to the first conductive layer pattern through the opening.

In one embodiment, the method may further comprise performing an EDS test and removing a bottom portion of the semiconductor wafer.

In one embodiment, the uppermost conductive layer pattern may be exposed upon removing the bottom portion of the semiconductor wafer.

In one embodiment, the via hole may be formed in a scribe lane region.

According to still another example embodiment, a method of manufacturing a semiconductor device may include forming an integrated circuit region on a semiconductor wafer; forming a first conductive layer pattern directly overlying the integrated circuit region; forming a via hole extending through the first conductive layer pattern and the integrated circuit region; forming an inter-metal dielectric (IMD) layer concurrently overlying the first conductive layer pattern and on sidewalls of the via hole; forming a second conductive layer pattern over the IMD layer and also within the via hole; and forming a plug within the via hole.

In one embodiment, an uppermost dielectric layer may be formed overlying the second conductive layer pattern after forming the plug.

According to yet another example embodiment, a semiconductor device may include an integrated circuit region formed on a semiconductor substrate; a first conductive layer pattern overlying the integrated circuit region, wherein a via hole extends through the first conductive layer pattern and the integrated circuit region and into a portion of the semiconductor substrate; an inter-metal dielectric (IMD) layer overlying the first conductive layer pattern, the IMD layer disposed on a bottom and sidewalls of the via hole; an uppermost conductive layer pattern overlying the IMD layer and within the via hole; a plug formed in the via hole; and an uppermost dielectric layer formed over the uppermost conductive layer pattern.

In one embodiment, the uppermost conductive layer pattern may directly contact the IMD layer and disposed within the via hole.

In one embodiment, the uppermost conductive layer pattern may be formed on sidewalls and a bottom of the via hole.

In one embodiment, an opening is formed in the IMD layer and the uppermost conductive layer pattern is electrically connected to the first conductive layer pattern through the opening.

In one embodiment, the uppermost dielectric layer may cover a portion of the plug.

In one embodiment, the uppermost dielectric layer may cover a portion of a top surface of the plug.

In one embodiment, the plug may extend above a top surface of the uppermost dielectric layer.

In one embodiment, the uppermost dielectric layer does not extend into the via hole.

In one embodiment, the plug may comprise a conductive material.

In one embodiment, the conductive material may comprise copper.

In one embodiment, the plug may comprise an insulating material.

According to a further example embodiment, a semiconductor device may include an integrated circuit region formed on a semiconductor substrate; a first conductive layer pattern overlying the integrated circuit region, wherein a via hole extends through the first conductive layer pattern and the integrated circuit region; an inter-metal dielectric (IMD) layer overlying the first conductive layer pattern, the IMD layer disposed on a bottom and sidewalls of the via hole; an uppermost conductive layer pattern overlying the IMD layer and within the via hole; a plug formed in the via hole; and uppermost dielectric layer covering a portion of a top surface of the plug.

In one embodiment, the uppermost conductive layer pattern may directly contact the IMD layer and disposed within the via hole.

According to one example embodiment, a method of forming a semiconductor package may include providing a first semiconductor device and a second semiconductor device. Each of the first and second semiconductor devices may include an integrated circuit region formed on a semiconductor substrate; a first conductive layer pattern overlying the integrated circuit region, wherein a via hole extends through the first conductive layer pattern and the integrated circuit region and into a portion of the semiconductor substrate; an inter-metal dielectric (IMD) layer overlying the first conductive layer pattern, the IMD layer disposed on a bottom and sidewalls of the via hole; an uppermost conductive layer pattern overlying the IMD layer and within the via hole; a plug formed in the via hole; and an uppermost dielectric layer overlying the uppermost conductive layer pattern. The method may further include disposing the first semiconductor device below the bottom surface of the semiconductor substrate of the second semiconductor device. An upper surface of the plug in the first semiconductor device may be electrically connected to the portion of the uppermost conductive layer pattern of the second semiconductor device.

In one embodiment, the uppermost conductive layer pattern may directly contact the IMD layer and be disposed within the via hole.

In one embodiment, the uppermost conductive layer pattern may be formed on sidewalls and a bottom of the via hole.

According to another example embodiment, a semiconductor package may include a first semiconductor device and a second semiconductor device. Each of the first and second semiconductor devices may include an integrated circuit region formed on a semiconductor substrate, wherein a via hole extends through the semiconductor substrate including the integrated circuit region; an inter-metal dielectric (IMD) layer disposed on a bottom and sidewalls of the via hole; an uppermost conductive layer pattern overlying the IMD layer and within the via hole, wherein a portion of the uppermost conductive layer pattern is exposed from a bottom surface of the semiconductor substrate; a plug formed in the via hole; and an uppermost dielectric layer overlying the uppermost conductive layer pattern. The first semiconductor device may be disposed below the bottom surface of the semiconductor substrate of the second semiconductor device. An upper surface of the plug in the first semiconductor device may be electrically connected to the portion of the uppermost conductive layer pattern of the second semiconductor device.

In one embodiment, a solder material may be interposed between the first and second semiconductor devices to electrically connect the upper surface of the plug in the first semiconductor device to the portion of the uppermost conductive layer pattern of the second semiconductor device.

In one embodiment, the uppermost dielectric layer may cover a portion of a top surface of the plug.

According to another example embodiment, a semiconductor device may include an integrated circuit region formed on a semiconductor substrate; a plurality of first conductive layer patterns overlying the integrated circuit region, wherein a first via hole extends through a first one of the plurality of first conductive layer patterns and the integrated circuit region and wherein a second via hole extends through a second one of the plurality of first conductive layer patterns and the integrated circuit region; an inter-metal dielectric (IMD) layer overlying the plurality of first conductive layer patterns, the IMD layer disposed on a bottom and sidewalls of the first via hole and disposed on a bottom and sidewalls of the second via hole; an uppermost conductive layer pattern overlying the IMD layer and disposed within the first via hole and within the second via hole; a first plug formed in the first via hole; a second plug formed in the second via hole; and an uppermost dielectric layer formed over the uppermost conductive layer pattern, wherein the uppermost dielectric layer covers the first plug and a portion of the uppermost conductive layer adjacent to the first plug and wherein the uppermost dielectric layer completely covers the first plug and a portion of the uppermost conductive layer adjacent to the first plug and wherein the second plug and a portion of the uppermost conductive layer adjacent to the second plug are exposed by the uppermost dielectric layer.

In one embodiment, a portion of the uppermost conductive layer pattern disposed within the first via hole may comprise a first chip selection pad, a portion of the uppermost conductive layer pattern disposed within the second via hole may comprise a second chip selection pad and a portion of the uppermost conductive layer pattern overlying the IMD layer between the first via hole and the second via hole may be a redistribution line electrically connecting the first chip selection pad to the second chip selection pad.

In one embodiment, the first plug and the second plug may comprise an insulating material.

In one embodiment, the first plug and the second plug may overlie an upper surface of the uppermost conductive layer pattern.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Various operations will be described as multiple discrete steps performed in a manner that is most helpful in understanding the invention. However, the order in which the steps are described does not imply that the operations are order-dependent or that the order that steps are performed must be the order in which the steps are presented.

Further, well-known structures and devices are not shown in order not to obscure the description of the invention with unnecessary detail.

While embodiments of the present invention have been particularly shown and described above, it will be understood by those of ordinary skill in the art that various changes in form and details may be made therein without departing from the spirit and scope of the present invention as defined by the following claims.

What is claimed is:

1. A method of forming a semiconductor package, comprising:
    providing a first semiconductor device and a second semiconductor device, each of the first and second semiconductor devices comprising:
        an integrated circuit region formed on a semiconductor substrate;
        a first conductive layer pattern overlying the integrated circuit region, wherein a via hole extends through the first conductive layer pattern and the integrated circuit region and into a portion of the semiconductor substrate;
        an inter-metal dielectric (IMD) layer overlying the first conductive layer pattern, the IMD layer disposed on a bottom and sidewalls of the via hole;
        an uppermost conductive layer pattern overlying the IMD layer and within the via hole;
        a plug formed in the via hole; and
        an uppermost dielectric layer overlying the uppermost conductive layer pattern; and
    disposing the first semiconductor device below the bottom surface of the semiconductor substrate of the second semiconductor device,
    wherein an upper surface of the plug in the first semiconductor device is electrically connected to the portion of the uppermost conductive layer pattern of the second semiconductor device.

2. The method of claim 1, wherein the uppermost conductive layer pattern directly contacts the IMD layer and disposed within the via hole.

3. The method of claim 2, wherein the uppermost conductive layer pattern is formed on sidewalls and a bottom of the via hole.

4. A semiconductor package, comprising:
    a first semiconductor device and a second semiconductor device, each of the first and second semiconductor devices comprising:
        an integrated circuit region formed on a semiconductor substrate, wherein a via hole extends through the semiconductor substrate including the integrated circuit region;
        an inter-metal dielectric (IMD) layer disposed on a bottom and sidewalls of the via hole;
        an uppermost conductive layer pattern overlying the IMD layer and within the via hole, wherein a portion of the uppermost conductive layer pattern is exposed from a bottom surface of the semiconductor substrate;
        a plug formed in the via hole; and an uppermost dielectric layer overlying the uppermost conductive layer pattern, wherein the first semiconductor device is disposed below the bottom surface of the semiconductor substrate of the second semiconductor device, and wherein an upper surface of the plug in the first semiconductor device is electrically connected to the portion of the uppermost conductive layer pattern of the second semiconductor device.

5. The package of claim 4, further comprising a solder material interposed between the first and second semiconductor devices to electrically connect the upper surface of the plug in the first semiconductor device to the portion of the uppermost conductive layer pattern of the second semiconductor device.

6. The package of claim 4, wherein the uppermost dielectric layer covers a portion of a top surface of the plug.

* * * * *